United States Patent [19]

Alexander

[11] 4,140,982
[45] Feb. 20, 1979

[54] TRANSISTOR MICROSTRIP OSCILLATOR AND DIODE ATTENUATOR MODULATOR

[75] Inventor: Wilson E. Alexander, Santa Clara, Calif.

[73] Assignee: Fairchild Camera and Instrument Corporation, Mountain View, Calif.

[21] Appl. No.: 885,711

[22] Filed: Mar. 13, 1978

[51] Int. Cl.$^2$ .......................... H03B 5/18; H03C 1/14
[52] U.S. Cl. .................................. 332/31 T; 325/125; 325/182; 331/99; 331/117 D; 332/52; 332/53
[58] Field of Search ...................... 332/31 R, 31 T, 52, 332/53; 325/125, 182; 358/23; 331/96, 99, 117 D

[56] References Cited

U.S. PATENT DOCUMENTS

| 3,189,836 | 6/1965 | Podell | 332/52 X |
| 4,047,127 | 9/1977 | Alexander | 332/31 T |

FOREIGN PATENT DOCUMENTS 117319  2/1959  U.S.S.R. .................................... 332/52

OTHER PUBLICATIONS

Draper, "Recent Developments in Solid State Sources for Microwave Instrumentation", Electronic Engineering, January 1974, pp. 54-58.
Hodowanec, "Microwave Transistor Oscillators", The Microwave Journal, June 1974, pp. 39-42, 62.

Primary Examiner—Siegfried H. Grimm
Attorney, Agent, or Firm—Alan H. MacPherson; Paul J. Winters

[57] ABSTRACT

An RF oscillator and modulator especially useful for UHF applications. The oscillator may comprise a series-tuned Colpitts circuit with the tuned circuit including microstrip transmission lines as impedance elements. The modulator includes a pair of serially connected diodes with the common terminal of the diodes receiving a modulation signal which varies the total current through the diodes. The diodes function as current-variable resistances to attenuate the carrier frequency signal in response to the modulation signal.

12 Claims, 2 Drawing Figures

TRANSISTOR MICROSTRIP OSCILLATOR AND DIODE ATTENUATOR MODULATOR

BACKGROUND OF THE INVENTION

1. Field of the Invention

This invention relates generally to electrical circuits and more particularly to electrical oscillators and modulators for radio frequency (RF) operation.

2. Prior Art

RF modulators and oscillators for use in home and commercial appliances typically must meet certain requirements in power and frequency output. For example, appliances such as video games, which may be operated with conventional television receivers, must comply with Government regulations on harmonic suppression and maximum output voltage to minimize spurious signal propagation.

Disclosed in U.S. Pat. No. 4,047,127 is an RF oscillator and modulator particularly designed for use at very high frequency (VHF) carrier signals such as used in the NTSC system of television broadcasting in the United States. The PAL system of television broadcasting commonly found in Europe, as well as the NTSC system, utilizes ultra-high frequency (UHF) carrier signals, and the higher frequency levels pose additional difficulties in harmonic suppression and output voltage control.

SUMMARY OF THE INVENTION

An object of the present invention is an improved RF oscillator and modulator particularly useful for UHF signal applications.

Briefly, the RF oscillator and modulator in accordance with the present invention includes an oscillator such as a series-tuned Colpitts oscillator for generation of a UHF signal and attenuation means for receiving the carrier signal from the oscillator with attenuation control provided by a modulation signal. Thus, the carrier signal which passes through the attenuation means is attenuated in accordance with the modulation signal thereby producing a modulated output signal at the carrier frequency.

More particularly, the attenuation means of the modulator includes a pair of serially connected diodes with the modulation signal applied at the common terminal of the diodes. Additionally, inductive means is interconnected between the anodes of the two diodes and in parallel with the diodes.

The oscillator includes a tuned circuit comprising an inductive element, a variable capacitor connected to the inductive element, and a fixed capacitor coupled to the inductive element wherein the inductive element comprises a first transmission line and the fixed capacitive element comprises a second transmission line capacitively and magnetically coupled to the first transmission line. In a preferred embodiment, the two transmission lines comprise microstrip elements formed on opposing sides of a printed circuit board.

The invention and objects and features thereof will be more readily apparent from the following detailed description and appended claims when taken with the drawing.

DESCRIPTION OF ILLUSTRATIVE EMBODIMENT

Figure 1:
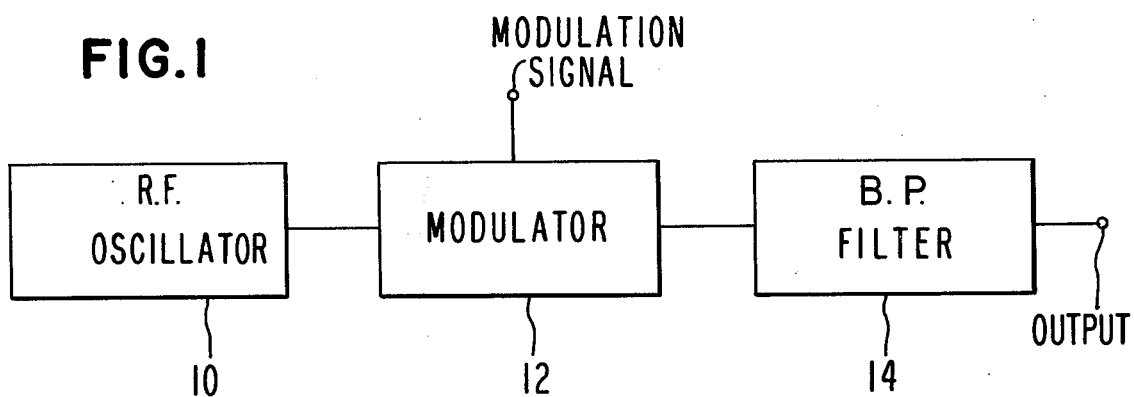
FIG. 1 is a simplified block diagram of the RF oscillator and modulator in accordance with the present invention.

Referring to the drawing, FIG. 1 is a simplified block diagram of the RF oscillator and attenuator in accordance with the present invention, and includes an oscillator 10 which, in an application such as a television broadcast system, will generate a UHF signal (e.g., 300 MHz and higher). The output of the oscillator 10 is connected to the input of attenuator 12 which has a linear attenuation range controlled by a modulation signal applied to the attenuator. Thus, an output signal from attenuator 12 includes a carrier signal at the oscillator frequency which is modulated by the modulation signal input to the attenuator, and filter 14 is included to eliminate any harmonics or spurious signals which might be passed from the attentuator. The output from filter 14 thus will consist of the modulated carrier signal. In a video application, the modulation signal will include chroma, luminance and audio signals.

Figure 2:
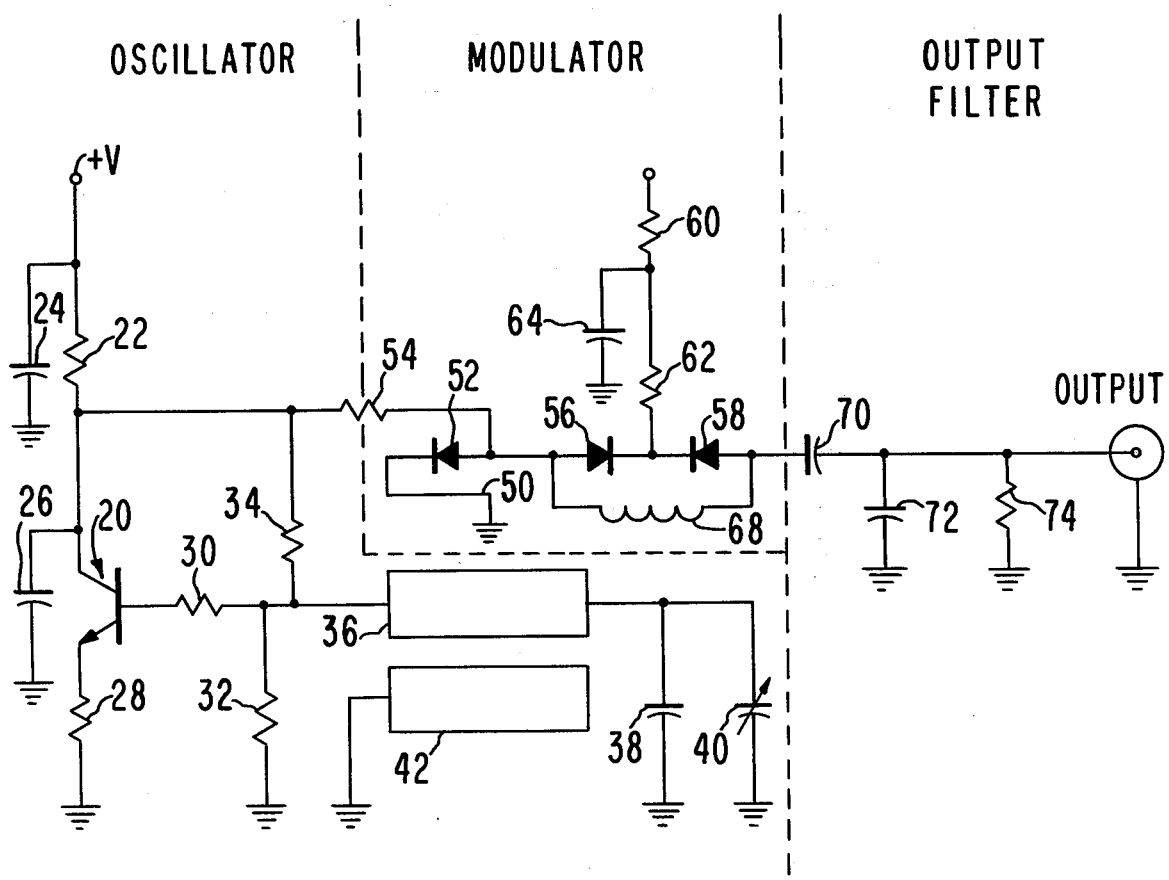
FIG. 2 is an electrical schematic of an RF oscillator and modulator in accordance with the invention.

Referring now to the electrical schematic illustrated in FIG. 2 of the drawing, the oscillator comprises a series-tuned Colpitts oscillator including a bipolar transistor 20 having its collector connected through resistor 20 to a +DC voltage supply. Capacitors 24 and 26 are connected to either terminal of resistor 22 to shunt RF signals to ground. The emitter of transistor 20 is connected through resistor 28 to circuit ground.

Serially connected resistors 30 and 32 connect the base of transistor 20 to ground, and a tuned circuit is connected to the common terminal of resistors 30 and 32 to provide the oscillation frequency of the oscillator. Resistor 34 is connected between the common terminal of resistors 30, 32 and the collector of transistor 20 to establish a DC bias level at the common terminal of resistors 30, 32. Advantageously for UHF signal generation, the tuned circuit comprises a first length of transmission line 36 which is serially connected between the common terminal of resistors 30, 32 and a variable capacitance comprising fixed capacitor 38 and variable capacitor 40 which are connected in parallel between the first transmission line 36 and circuit ground. A second transmission line 42 is capacitively and magnetically coupled to the first transmission line 36 and is connected to circuit ground. In a preferred embodiment of the oscillator, the circuit is formed on a printed circuit board with the first and second transmission lines comprising microstrips which are formed on opposing surfaces of the printed circuit board and are coupled through the board.

The modulator includes a conductive lead 50 which, in a preferred embodiment, is placed in close proximity to the first transmission line 36 and is magnetically coupled thereto to receive the oscillator carrier frequency. The carrier signal generated in conductive lead 50 passes through diode 52, or other suitable voltage reference means, to the input of the attenuator. A high ohmage resistor 54 is connected between the collector of transistor 20 and the anode of diode 52 to establish a DC voltage level at the anode of diode 52.

The attenuator includes a first diode 56 and a second diode 58 which are serially connected with the cathodes of the diodes connected to a common terminal. Alternatively, the diodes can be reversed with the anodes connected together and suitable voltage biasing provided to maintain current flow through the diodes. A modulation signal is applied to the common terminal through a low pass filter comprising serially connected resistors 60 and 62 with a capacitor 64 connected between the common terminal of resistors 60, 62 and circuit ground. A suitable inductive element 68 shunts the two diodes 56, 58 whereby the DC voltage level on the anodes of diodes 56, 58 is essentially the same. Because of the DC bias established at the anode of diode 56 by means of resistor 54, both diodes 56, 58 will always be conducting current. However, the current passing through the diodes is of very low magnitude whereby the resistance of the two diodes is essentially linearly proportional to the current passing therethrough.

In operation the carrier signal which is coupled to conductor 50 and passed through diode 52 to the attenuator travels through the serially connected diodes 56, 58 and is attenuated by the variable resistance thereof which is determined by the modulation signal impressed on the common terminal of diodes 56, 58.

The anode of diode 56 is biased by the voltage across diode 52 to approximately 1.6 volts in a preferred embodiment. The anode of diode 58 is biased with the RF choke inductor 68 which is connected to the anode of diode 56. Thus, the two diodes are in series for RF current and in parallel for modulation current. The modulation current should never reach zero, and the signal levels are such that the diodes are acting as current-controlled resistors rather than diodes. This allows low-cost silicon diodes to be used far past their normal operating frequency range, and the operating frequency is further increased by selecting the bias inductor 68 to resonate the diode capacitance. For maximum linearity, the diode resistance must be high as compared to the source and load impedance. The two diodes in series plus the resonating bias inductor allows a much higher impedance than a single-diode modulator and thus greater linearity.

The modulated signal taken at the anode of diode 58 is passed through an output filter comprising series capacitor 70, shunt capacitor 72 and shunt resistor 74 to the output terminal.

The two-diode modulator in accordance with the present invention produced low harmonic generation since the carrier signal sees the nonlinearity of the first diode partially cancelled by the nonlinearity of the second diode. By properly selecting the inductor 68, the effects of diode capacitance are minimized, thereby giving an attenuation range of greater than 30 dB. Further, the modulation signal does not appear in the oscillator or at the output filter, thus minimizing frequency modulation in the oscillator and simplifying the output filter. Further, reactive loading of the modulation voltage is reduced, thus improving modulation bandwidth which, in a video application, provides improved color signals.

In one specific embodiment, the following device values were used:

| | |
|---|---|
| 20: FRT 129 | 40: 1 – 5 pf |
| 22: 56 Ω | 42: microstrip |
| 24: 0.01 μf | 52: FLV 110 |
| 26: 47 pf | 54: 1.5 KΩ |
| 28: 820 Ω | 56: 1N4148 |
| 30: 27 Ω | 58: 1N4148 |
| 32: 1.5 KΩ | 60: 220Ω |
| 34: 1.5 KΩ | 62: 470 Ω |
| 36: microstrip | 64: 47 pf |
| 38: 8 pf | 68: 0.15 μH |
| 70: 33 pf | 74: 68 Ω |
| 72: 5 pf | Carrier frequency: 600 MHz |

The described oscillator and modulator has proved to be efficient and economical particularly in UHF video applications. It will be readily appreciated by those skilled in the art that the advantages of the circuit and modifications thereof can be utilized in other applications. While the invention has been described with reference to a specific embodiment, the description is illustrative and is not to be construed as limiting the scope of the invention. Various modifications and applications will occur to those skilled in the art without departing from the spirit and scope of the invention as defined by the appended claims.

What is claimed is:

1. An oscillator and modulator for RF signal applications comprising:
   an oscillator including a circuit tuned to the desired oscillation frequency, and attenuation means having an input for receiving the signal from said oscillator, an attenuation control signal terminal for receiving a modulation signal, and an output terminal for providing a signal at the desired oscillation frequency which is modulated by said modulation signal, said attenuation means comprising first and second diodes serially connected between said input and said output terminal with said attenuation control signal terminal connected to the common terminal of said diodes, wherein said attenuation means further includes inductive means interconnected between the anode of said first diode and the anode of said second diode and in parallel with said first and second diodes.

2. An oscillator and modulator as defined by claim 1 and including a band pass filter connected to said output terminal of said attenuation means which passes desired oscillator frequency and attenuates harmonics thereof.

3. An oscillator and modulator as defined by claim 2 wherein said oscillator comprises
   a bipolar transistor having emitter, base and collector regions,
   voltage bias means connected to said collector and emitter regions, and
   a tuned circuit including an inductive element having first and second terminals, a variable capacitive element connecting said first terminal of said inductive element to said voltage bias means, a fixed capacitive element effectively connecting said first terminal of said inductive element to said voltage bias means, and means connecting said second terminal to said base of said transistor, said inductive element comprising a first strip transmission line and said fixed capacitive element comprising a second strip transmission line coupled to said first strip transmission line.

4. An oscillator and modulator as defined by claim 3 wherein said oscillator includes a printed circuit board and said first and second transmission lines comprise microstrip elements formed on opposing sides of said printed circuit board.

5. An oscillator and modulator for RF signal applications comprising: an oscillator including a circuit tuned to the desired oscillation frequency, and attenuation means having an input for receiving the signal from said oscillator, an attenuation control signal terminal for receiving a modulation signal, and an output terminal for providing a signal at the desired oscillation frequency which is modulated by said modulation signal, said attenuation means comprising first and second diodes serially connected between said input and said output terminal with said attenuation control signal terminal connected to the common terminal of said diodes, wherein said oscillator comprises a bipolar transistor having emitter, base and collector regions, voltage bias means connected to said collector and emitter regions, and a tuned circuit including an inductive element having first and second terminals, a variable capacitive element connecting said first terminal of said inductive element to said voltage bias means, a fixed capacitive element effectively connecting said first terminal of said inductive element to said voltage bias means, and means connecting said second terminal to said base of said transistor, said inductive element comprising a first strip transmission line and said fixed capacitive element comprising a second strip transmission line coupled to said first strip transmission line.

6. An oscillator and modulator as defined by claim 5 wherein said oscillator includes a printed circuit board and said first and second strip transmission lines comprise microstrip elements formed on opposing sides of said printed circuit board.

7. An oscillator and modulator as defined by claim 6 wherein said first and second diodes are serially connected with a common cathode terminal.

8. An RF modulator comprising:
a first diode having an anode and a cathode,
a second diode having an anode and a cathode,
means connecting said first diode in series with said second diode, with said diodes having a common terminal,
inductive means interconnected in parallel with said first and second diodes,
a carrier signal receiving terminal connected to said first diode,
a modulation signal receiving terminal connected to said common terminal of said first and second diodes, and
a modulated carrier signal output terminal connected to said second diode.

9. An RF modulator as defined by claim 8 wherein the cathode of said first diode is connected to the cathode of said second diode.

10. An RF modulator as defined by claim 8 and further including a filter connected to said modulation signal receiving terminal for removing signal frequencies above the frequency of said modulation signal.

11. An RF oscillator particularly useful for generating a UHF signal comprising
a bipolar transistor having emitter, base and collector regions,
voltage bias means connected to said collector and emitter regions, and
a tuned circuit including an inductive element having first and second terminals, a variable capacitive element connecting said first terminal of said inductive element to said voltage bias means, a fixed capacitive element effectively connecting said first terminal of said inductive element to said voltage bias means, and means connecting said second terminal to said base of said transistor, said inductive element comprising a first strip transmission line and said fixed capacitive element comprising a second strip transmission line coupled to said first strip transmission line.

12. An RF oscillator as defined by claim 11 wherein said oscillator includes a printed circuit board and said first and second strip transmission lines comprise microstrip elements formed on opposite sides of said printed circuit board.

* * * * *